United States Patent
Dou et al.

(10) Patent No.: US 9,831,098 B2
(45) Date of Patent: Nov. 28, 2017

(54) METHODS FOR FABRICATING INTEGRATED CIRCUITS USING FLOWABLE CHEMICAL VAPOR DEPOSITION TECHNIQUES WITH LOW-TEMPERATURE THERMAL ANNEALING

(71) Applicant: GLOBALFOUNDRIES, Inc., Grand Cayman (KY)

(72) Inventors: Xinyuan Dou, Clifton Park, NY (US); Sukwon Hong, Albany, NY (US); Satyajit Shinde, Ballston Lake, NY (US); Sandeep Gaan, Clifton Park, NY (US); Tao Han, Clifton Park, NY (US); Carlos Chacon, Wilton, NY (US); Shimpei Yamaguchi, Ballston Lake, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 176 days.

(21) Appl. No.: 14/797,337

(22) Filed: Jul. 13, 2015

(65) Prior Publication Data

US 2017/0018452 A1 Jan. 19, 2017

(51) Int. Cl.
*H01L 21/3105* (2006.01)
*H01L 29/423* (2006.01)
*H01L 29/66* (2006.01)
*H01L 21/762* (2006.01)

(52) U.S. Cl.
CPC .... *H01L 21/3105* (2013.01); *H01L 21/76229* (2013.01); *H01L 29/42356* (2013.01); *H01L 29/66795* (2013.01)

(58) Field of Classification Search
CPC ........... H01L 21/3105; H01L 21/76229; H01L 29/42356; H01L 29/66795
See application file for complete search history.

(56) References Cited

U.S. PATENT DOCUMENTS

| 7,582,555 | B1 | 9/2009 | Lang et al. | |
|---|---|---|---|---|
| 2011/0151677 | A1* | 6/2011 | Wang | H01L 21/02343 438/773 |
| 2014/0306317 | A1 | 10/2014 | Licausi | |
| 2014/0353795 | A1 | 12/2014 | Tong et al. | |
| 2017/0053798 | A1* | 2/2017 | Wang | H01L 21/02348 |

* cited by examiner

*Primary Examiner* — John P Dulka
(74) *Attorney, Agent, or Firm* — Lorenz & Kopf, LLP

(57) ABSTRACT

Methods for fabricating integrated circuits are provided. In one example, a method for fabricating an integrated circuit includes forming an isolation trench between two fin structures on an integrated circuit substrate, forming a flowable film in the isolation trench using a flowable chemical vapor deposition process, and annealing the flowable film to form a silicon oxide dielectric layer in the isolation trench. The annealing is performed at a temperature of less than about 200° C. with a process gas including $N_2$ and $H_2O_2$.

20 Claims, 5 Drawing Sheets

METHODS FOR FABRICATING INTEGRATED CIRCUITS USING FLOWABLE CHEMICAL VAPOR DEPOSITION TECHNIQUES WITH LOW-TEMPERATURE THERMAL ANNEALING

TECHNICAL FIELD

The technical field relates generally to methods for fabricating integrated circuits, and more particularly relates to methods for fabricating integrated circuits using flowable chemical vapor deposition (FCVD) techniques with low-temperature thermal annealing.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FinFET is a type of transistor that lends itself to the goals of reducing transistor size while maintaining transistor performance. The FinFET is a non-planar, three dimensional transistor formed in and on a thin fin that extends upwardly from a semiconductor substrate. The semiconductor substrate may be a bulk silicon wafer from which the fins are formed or may be a silicon-on-insulator (SOI) wafer disposed on a support substrate. The SOI wafer includes a silicon oxide layer and a silicon-containing material layer overlying the silicon oxide layer. The fins are formed from the silicon-containing material layer. The fins are typically formed using conventional photolithographic or anisotropic etching processes (e.g., reactive ion etching (RIE) or the like).

The following brief explanation is provided to identify some of the unique features of FinFETs. FIG. 1 illustrates, in a cut away perspective view, a portion of a FinFET integrated circuit (IC) 10 known from the prior art. As illustrated, the IC 10 includes two fins 12 and 14 that are formed from and extend upwardly from a bulk semiconductor substrate 16. A gate electrode 18 overlies the two fins 12 and 14 and is electrically insulated from the fins 12 and 14 by a gate insulator (not illustrated). An end 20 of the fin 12 is appropriately impurity doped to form a source (not shown) of a FinFET 22, and an end 24 of the fin 12 is appropriately impurity doped to form a drain (not shown) of the FinFET 22. Similarly, the ends 26 and 28 of the fin 14 form the source and drain, respectively, of another FinFET 30.

The illustrated portion of IC 10 thus includes two FinFETs 22 and 30 having a common gate electrode 18. In another configuration, if the ends 20 and 26 that form the sources are electrically coupled together and the ends 24 and 28 that form the drains are electrically coupled together, the structure would be a two-fin FinFET having twice the gate width of either FinFET 22 or 30. An oxide layer 32 deposited onto the bulk semiconductor substrate 16 forms electrical isolation (e.g., shallow trench isolation (STI)) structures between the fins 12 and 14 and between adjacent devices as is needed for the circuit being implemented. The channel of the FinFET 22 extends along a sidewall 34 of the fin 12 beneath the gate electrode 18, along a top 36 of the fin 12, as well as along an opposite sidewall not visible in this perspective view. The advantage of the FinFET structure is that although the fin 12 has only a narrow width (indicated by the arrows 38), the channel has a width represented by at least twice the height of the fin 12 above the oxide layer 32. The channel width thus can be much greater than fin width.

The fins 12 and 14 are formed according to known processes. For instance, portions of the bulk semiconductor substrate 16 are etched or otherwise removed leaving the fins 12 and 14. The oxide layer 32 is formed by depositing and planarizing a dielectric material via FCVD and CMP processes, respectively, and partially etching the dielectric material to expose the upper portions of the fins 12 and 14. As noted above, it is the formation of this oxide layer using convention FCVD with high-temperature annealing that has caused some of process variabilities such as fin bending and insufficient oxide layer densification. The gate electrode 18 is then formed across the fins 12 and 14. Gate oxide insulator and/or nitride capping layers (not shown) may be deposited over the fins 12 and 14 before the gate electrode 18 is formed. The gate electrode 18 is formed by typical lithographic processing.

Electrical isolation of the fins is necessary to avoid electromechanical interference (EMI) and/or parasitic leakage paths between the various devices. Isolating fins on a bulk silicon wafer is especially problematic as the silicon of the bulk silicon wafer between the fins forms a conductive path. Shallow trench isolation (STI) is a technique used to electrically isolate transistors or electrical devices. Typically, STI structures are created during a relatively early fabrication stage(s), before the transistors are formed. A conventional STI process for FinFET devices involves creating isolation trenches in the semiconductor substrate through an anisotropic etch process. The isolation trench between each adjacent fin structures has a relatively high aspect ratio (e.g., ratio of the depth of the isolation trench to its width). A dielectric filler material, such as silicon oxide, is deposited into the isolation trenches to fill the isolation trenches. The deposited dielectric material may then be polished by a chemical-mechanical polishing (CMP) process that removes the excess dielectric material and creates a planar STI structure. The planarized oxide is etched back to form partially recessed uniformly thick oxide STI structures between the fin structures and to expose the upper vertical sidewalls of the fins for further processing.

As FinFET devices are designed at smaller and smaller scales, however, such as at the 14 nm regime, the 10 nm regime, and beyond, it becomes increasingly difficult to adequately and reliably form the STI structures in the isolation trenches. One solution proposed in the prior art is the use of flowable chemical vapor deposition (FCVD) techniques to fill the isolation trenches and form the STI structures. FCVD methods involve placing a substrate into a reaction chamber and introducing a vapor phase silicon-containing compound and an oxidant into the chamber. Reactor conditions are controlled so that the silicon-containing compound and the oxidant are made to react and condense onto the substrate. The chemical reaction causes the formation of a flowable film, for example including Si—OH, Si—H, and Si—O bonds. The flowable film reliably fills isolation trenches on the substrates. The flowable film is then converted into a final, solid silicon oxide film, for example by high-temperature plasma or thermal annealing.

While FCVD has been demonstrated to adequately and reliably fill high aspect ratio trenches for forming STI structures at increasingly smaller pitches, current FCVD processes, which use relatively high temperature plasma or thermal annealing (i.e., about 600° C. or greater), introduce other problems, particularly with regard to process variability. For example, it has been shown that high-temperature thermal annealing leads to "shrinkage" of the flowable film when converted into the final silicon oxide film. This shrinkage causes uneven stresses to develop along the fin length, which can lead to undesirable fin bending. As an additional example, high-temperature annealing may also result in insufficient densification of the flowable film when converted into the final silicon oxide film. Thus, insufficient densification may lead to variable etch rates along the resulting STI structure, which can cause uneven STI heights and other variabilities in subsequently-deposited layers of the FinFET. Moreover, apart from the STI structure formation, high-temperature annealing may damage other portions of the FinFET structure. For example, with the introduction of super steep retrograde wells (SSRWs) for the 10 nm regime and smaller, relatively low temperatures are generally maintained throughout the fabrication process to avoid damage to these SSRWs. Accordingly, the prior art, which uses high-temperature thermal annealing with FCVD processes to form high aspect ratio STI structures, is clearly deficient.

Accordingly, it is desirable to provide integrated circuits including FinFET devices with shallow trench isolation that include a dielectric fill that is less susceptible to process variability. In addition, it is desirable to maintain a low "thermal budget" (i.e., a relatively low temperature) throughout the fabrication process to allow for the use of temperature sensitive structures such as SSRWs in small-pitch devices. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In one exemplary embodiment, a method for fabricating an integrated circuit includes forming an isolation trench between two fin structures on an integrated circuit substrate, forming a flowable film in the isolation trench using a flowable chemical vapor deposition process, and annealing the flowable film to form a silicon oxide dielectric layer in the isolation trench. The annealing is performed at a temperature of less than about 200° C. in the presence of a process gas including $N_2$ and $H_2O_2$.

In another exemplary embodiment, a method for fabricating an integrated circuit includes forming an isolation trench between two fin structures on an integrated circuit substrate at a pitch of 14 nm or smaller, depositing a flowable film including Si—O, Si—H, and Si—OH bonds in the isolation trench using a flowable chemical vapor deposition process that supplies a silicon-containing compound and an oxidant, and annealing the flowable film to form a silicon oxide dielectric layer in the isolation trench. The annealing is performed at a temperature of less than about 150° C. but greater than 50° C. in the presence of a process gas including $N_2$ and $H_2O_2$ at a ratio of about 3:1 to about 1:3, and for a time period of about 4 hours to about 8 hours.

In yet another exemplary embodiment, a method for fabricating an integrated circuit includes forming an isolation trench between two fin structures on an integrated circuit substrate at a pitch of 14 nm or smaller, depositing a flowable film including Si—O, Si—H, and Si—OH bonds in the isolation trench using a flowable chemical vapor deposition process that supplies a silicon-containing compound and an oxidant, and annealing the flowable film to form a silicon oxide dielectric layer in the isolation trench. The annealing is performed at a temperature of less than about 150° C. with a process gas including $N_2$ and $H_2O_2$ at a ratio of about 3:1 to about 1:3, and for a time period of about 4 hours to about 8 hours. The method further includes planarizing the silicon oxide dielectric layer to form a planarized silicon oxide dielectric layer, etching the planarized silicon oxide dielectric layer to form an etched silicon oxide shallow trench isolation structure, and forming a transistor gate over the two fin structures and over the etched silicon oxide shallow trench isolation structure.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof Furthermore, there is no intention to be bound by any theory presented in the preceding background or the following detailed description.

In order to overcome the above-noted deficiencies of the prior art, a flowable

CVD process in accordance with the present disclosure utilizes a low-temperature annealing process to form the silicon oxide film from the deposited flowable film. As used herein, the term "flowable" refers to a physical state of matter wherein the matter flow and conforms to the space on which it is applied. As used herein, the term "low-temperature annealing" refers to annealing that is performed at a temperature of less than about 200° C., for example, less than about 150° C., such as less than about 100° C. The low-temperature annealing process is facilitated in the presence of a process gas including $H_2O_2$ and $N_2$ in the annealing chamber. The use of this low-temperature annealing process in the presence of the process gas is described in connection with the fabrication of an exemplary FinFET integrated circuit in the Figures that follow.

Figure 1:
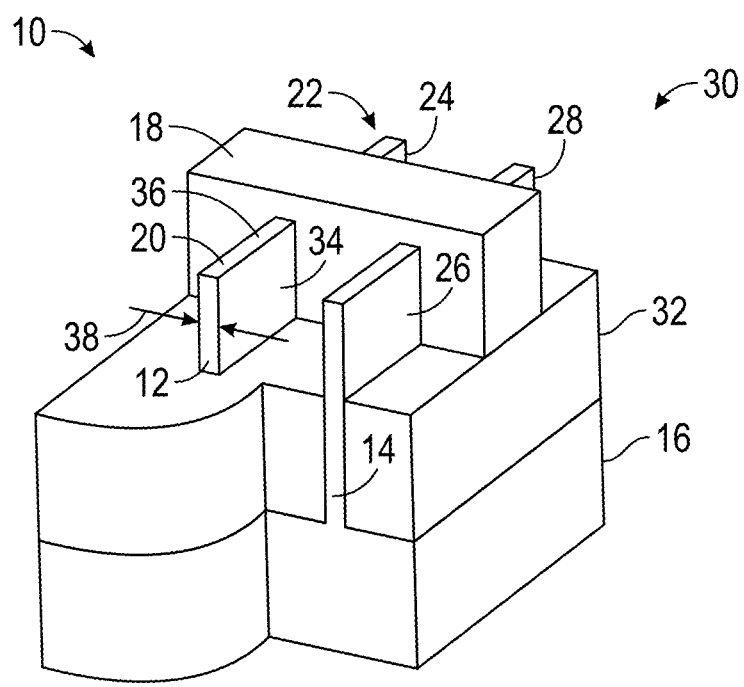
FIG. 1 illustrates a FinFET from the prior art in a partially cut away perspective view.

FIGS. 2-5 illustrate methods for forming a FinFET IC 40 in accordance with various embodiments. In particular, FIGS. 2-5 are cross-sectional views of the IC 40 including a plurality of fins 42 (similar to the fins 12 and 14 shown in FIG. 1) during various early fabrication stages of the IC 40. The described process steps, procedures, and materials are to be considered only as exemplary embodiments designed to illustrate to one of ordinary skill in the art methods for practicing the methods contemplated herein; the methods are not limited to these exemplary embodiments. Various steps in the manufacture of ICs are well known and so, in the interest of brevity, many conventional steps will only be mentioned briefly herein or will be omitted entirely without providing the well known process details.

Figure 2:
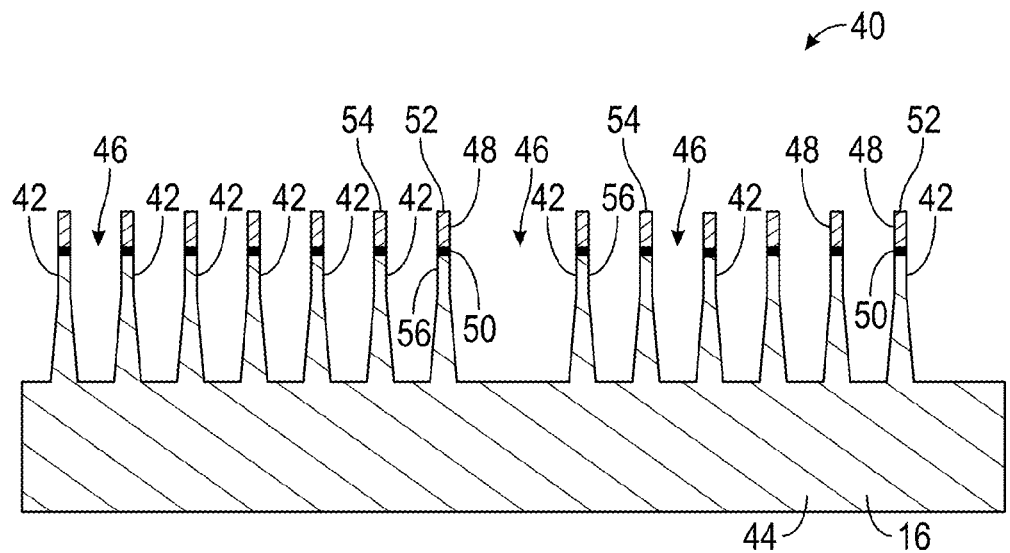
FIGS. 2-5 illustrate, in cross-sectional views, integrated circuits and methods for fabricating integrated circuits during various stages of its fabrication in accordance with an exemplary embodiment.

FIG. 2 illustrates, in cross-sectional view, a portion of the IC 40 at an early fabrication stage in accordance with an exemplary embodiment. In the illustrated embodiment, the IC 40 is fabricated on a semiconductor substrate 16 that is formed of a semiconductor material. In an exemplary embodiment, the semiconductor substrate 16 is a bulk silicon substrate and the semiconductor material includes silicon. For example, the bulk silicon substrate 16 can be formed from relatively pure silicon, silicon admixed with germanium or carbon, or silicon admixed with some other semiconductor material(s) commonly used in the fabrication of integrated circuits. Alternatively, the semiconductor material of the bulk semiconductor substrate 16 can be germanium, gallium arsenide, or the like. The semiconductor material need not be doped, although it may be very lightly doped as either N-type or P-type, without impacting the manufacturing process described herein. Further alternatively, a SOI substrate (not shown) may be used in place of the bulk semiconductor substrate 16.

A plurality of STI trenches 46 are formed into the bulk semiconductor substrate 16 to define the fins 42 that are spaced apart from each other by the STI trenches 46. Thus, a given STI trench 46 is formed between two of the fins 42. In an exemplary embodiment, the STI trenches 46 are formed by initially depositing a hard mask 48 overlying the bulk semiconductor substrate 16. In one example, the hard mask is formed by depositing an oxide layer 50 and a silicon nitride layer 52 overlying the bulk semiconductor substrate 16. Well known process techniques, such as chemical vapor deposition (CVD) and/or the like, may be used to form the oxide layer 50 and the silicon nitride layer 52. Next, the hard mask 48 is patterned through a conventional lithography technique and the bulk semiconductor substrate 16 is selectively etched through the pattern in the hardmask 48 using, for example, an anisotropic etching process such as a plasma enhanced RIE process to form the STI trenches 46. The patterned hardmask 48 remains as a plurality of nitride caps that correspondingly overlie upper portions 56 of the fins 42. It should be appreciated that embodiments of the present disclosure are particularly-well suited for use in small pitch devices, such as those in the 14 nm regime, 10 nm regime, and smaller.

Figure 3:
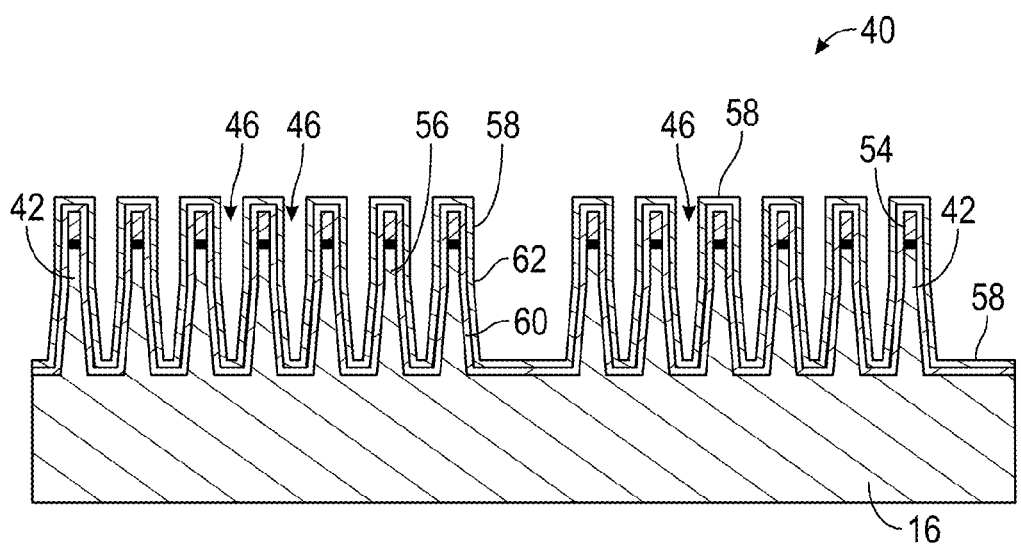

FIG. 3 illustrates, in cross-sectional view, the IC 40 at a further advanced fabrication stage in accordance with an exemplary embodiment. An STI liner 58 is formed overlying the fins 42 and the nitride caps 48. The STI liner 58 helps protect the upper portions 56 of the fins 42 and the nitride caps 48 during subsequent processing as will be discussed in further detail below. In an exemplary embodiment, the STI liner 58 includes an oxide liner 60 overlying the fins 42 and a silicon nitride liner 62 overlying the oxide liner 60. The oxide liner 60 is formed using thermal techniques to grow an oxide material layer overlying the fins 42. In an exemplary embodiment, the oxide liner 60 has a thickness of from about 5 to about 25 Å. The silicon nitride liner 62 may be formed, for example, by a CVD process. In an exemplary embodiment, the silicon nitride liner 62 has a thickness of from about 10 to about 40 Å.

Figure 4:
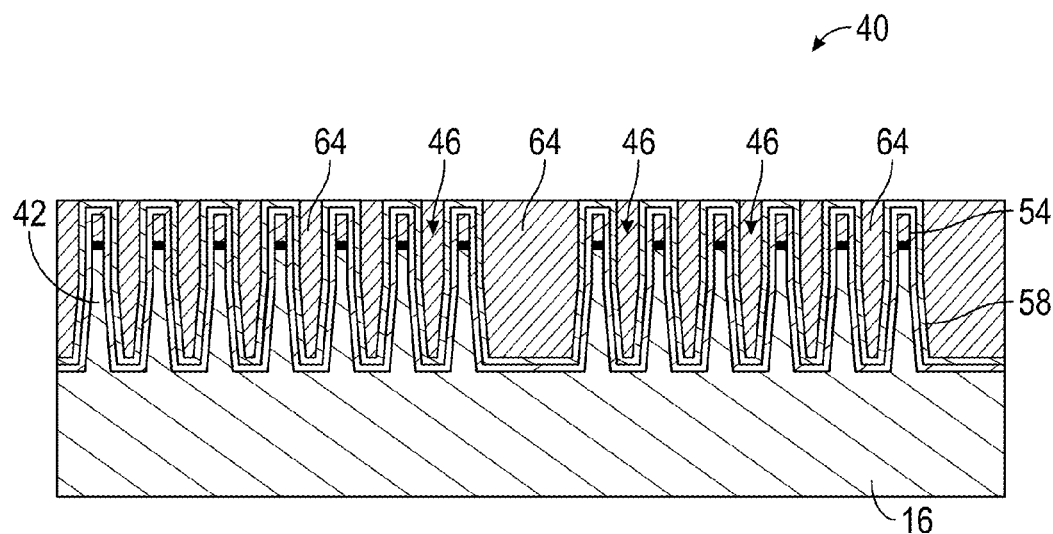

The process continues as illustrated in FIG. 4 by filling the STI trenches 46 with a solid silicon oxide film 64 using a flowable CVD process with a low-temperature anneal in the presence of a process gas in accordance with the present disclosure. The exemplary flowable CVD process includes providing the intermediate-stage IC 40 shown in FIG. 3 into a reaction chamber. Providing the IC 40 into the reactor may involve clamping it to a pedestal or other support in the chamber. For this purpose, an electrostatic or mechanical chuck may be employed.

After the IC 40 of FIG. 3 is provided into the reaction chamber, a precursor gas is introduced. The precursor gas includes a silicon-containing compound and an oxidant. The precursor gas may also include one or more dopant precursors. Sometimes, though not necessarily, an inert carrier gas is present. In certain embodiments, the precursor gas is introduced into the reaction chamber using a liquid injection system. Typically, the silicon-containing compound and the oxidant are introduced into the reaction chamber via separate inlets. In certain embodiments, the a compound that contributes to reducing the reaction rate at the wafer surface is introduced into the reaction chamber along with the oxidant. Examples of compounds that reduce the reaction rate include alcohols, e.g., ethanol and isopropyl alcohol. Reducing the reaction rate at the wafer surface may be desirable to facilitate continuous film propagation and growth. Also, in certain embodiments, the reactants may be provided in a manner that increases residence time over the surface of the IC 40. For example, in some embodiments, an inert gas (e.g., He, Ar or $N_2$) ballast is provided to increase reactant utilization. The ballast is provided below a baffle plate assembly. This constricts the flow of reactants, thereby increasing their resident time over the surface of the IC 40.

The IC 40 of FIG. 3 is exposed to the precursor gas within the reaction chamber. Conditions in the reaction chamber are such that the silicon-containing compound and the oxidant react and condense. A flowable film is thereby deposited on the surface of IC 40. The IC 40 is exposed to the precursor gas for a period sufficient to deposit the flowable film to fill the STI trenches 46. The deposition process typically forms the flowable film with a soft, jelly-like consistency with good flow characteristics, providing a consistent fill even in high-aspect ratio trenches. After the flowable film has been deposited in the STI trenches 46, the as-deposited flowable film is converted to a solid (i.e., non-flowable) silicon oxide dielectric film. The film is converted by exposure to a low-temperature thermal annealing process in the presence of a process gas as described in further detail below.

As noted above, the precursor gas contains a silicon-containing compound and an oxidant. Suitable silicon-containing compounds include organo-silanes and organo-siloxanes. In certain embodiments, the silicon-containing compound is a commonly available liquid phase silicon source. In some embodiments, a silicon-containing compound having one or more mono, di, or tri-ethoxy, methoxy or butoxy functional groups is used. Examples include, but are not limited to, tri-ethoxy silane (TES), diethoxy silane (DES), triphenylethoxysilane, 1-(triethoxysilyl)-2-(diethoxymethylsilyl)ethane, tri-t-butoxylsilanol, and tetramethoxy silane. Examples of suitable oxidants include ozone, hydrogen peroxide and water. An exemplary oxidant is a combination of hydrogen peroxide and water.

In some embodiments, the silicon-containing compound and the oxidant are delivered to the reaction chamber via liquid injection system that vaporizes the liquid for introduction to the chamber. The reactants are typically delivered separately to the chamber. Typical flow rates of the liquid introduced into a liquid injection system are from about 0.1 to about 5.0 mL/min per reactant. Of course, one of skill in the art will understand that optimal flow rates depend on the particular reactants, desired deposition rate, reaction rate and other process conditions. Acceptable silicon-containing compound/oxidant flow ratios are variable, as there is typically only a single reaction. Examples of suitable ratios include 3:1-1:100. The flowable film deposited on the IC 40 typically includes some combination of Si—O, Si—H, and Si—OH bonds.

Reactions conditions are such that the silicon-containing compound and oxidant, undergo a condensation reaction, condensing on the substrate surface to form a flowable film. The reaction typically takes place in dark or non-plasma conditions. Chamber pressure may be from about 1-100 Torr, in certain embodiments, it is between 5 and 20 Torr, or 10 and 20 Torr. Substrate temperature is typically from about −20 to about 100° C. In certain embodiments, temperature is from about 0 to about 35° C. Pressure and temperature may be varied to adjust deposition time. High pressure and low temperature are generally favorable for quick deposition. Conversely, high temperature and low pressure will result in slower deposition time. Exposure time depends on reaction conditions as well as the desired film thickness. Deposition rates are typically from about 100 angstroms/min to about 1 micrometer/min.

After the flowable film is deposited on the IC 40, it is converted to a solid silicon dioxide film 64. A low-temperature thermal anneal with a process gas, including a combination of $N_2$ and $H_2O_2$ gasses, may be used to convert the film into a solid oxide. In embodiments, the molar ratio of $N_2$ to $H_2O_2$ may be from about 3:1 to about 1:3, for example from about 2:1 to about 1:2. The annealing temperature may be less than about 200° C., for example, less than about 150° C., such as less than about 100° C., while remaining greater than about 50° C. Annealing pressure is typically atmospheric. Annealing may be performed for any suitable period of time depending on the size of the trenches 46, and may be from about 4 hours to about 8 hours, such as about 5 hours to about 7 hours.

The low-temperature flowable CVD may be performed in a wide-range of reaction chambers. The methods may be implemented on any chamber equipped for deposition of dielectric film, including HDP-CVD reactors, PECVD reactors, any chamber equipped for CVD reactions, and chambers used for PDL (pulsed deposition layers). Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the IC 40 in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate. The structure illustrated in FIG. 4, including the solid silicon oxide film 64, results from the above-described low-temperature anneal process followed by a planarization of the solid silicon oxide film 64, for example using CMP.

Figure 5:
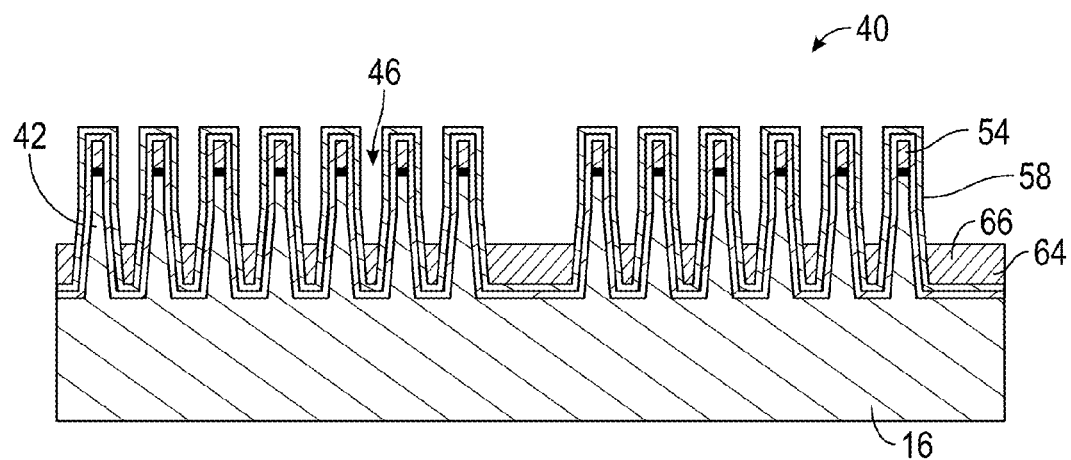

Thereafter, FIG. 5 illustrates, in cross-section, the IC 40 at further advanced fabrication stages in accordance with an exemplary embodiment. The solid silicon oxide film 64 is etched to form a recessed oxide fill 66. The recessed oxide fill 66 may be formed using a wet etching process and/or a dry etching process. In an exemplary embodiment, the solid silicon oxide film 64 is etched using multiple etching processes including a dry etching process, such as a plasma enhanced RIE process, a SiCoNi etching process, and/or a COR etching process. As is known in the art, a SiCoNi etching process is a remote plasma assisted dry etching process that involves the simultaneous exposure of the partially fabricated IC 40 including the bulk semiconductor substrate 16 to $H_2$, $NF_3$, and $NH_3$ plasma by-products. Remote plasma excitation of the hydrogen and fluorine species allows substantially plasma-damage-free substrate processing. The SiCoNi etching process is largely conformal and selective towards silicon oxide but does not readily etch silicon regardless of whether the silicon is amorphous, crystalline, or polycrystalline. Also, as is well known in the art, the COR etching process is a dry etching process that employs gaseous reactants including HF and $NH_3$ to selectively etch silicon oxide. In an exemplary embodiment, the wet etching process is performed with an etchant, such as dilute HF or the like, that selectively etches silicon oxide but does not readily etch silicon. In an exemplary embodiment, about 1000 to about 2000 Å of the solid silicon oxide film 64 is removed during etching to form the recessed oxide fill 66 that has a thickness of from about 300 to about 1000 Å.

The electrically-isolated fins 42 thus formed may be used as the basis to fabricate a FinFET integrated circuit according to a given circuit design using known further processing steps. For example, FinFET transistor structures may thereafter be completed in a conventional manner, for example, by depositing and patterning a gate electrode material to form gate electrodes over the fin structures according to the IC design. Further processing steps may also include providing electrical contacts to source and drain regions and to the gate electrodes structures. Non-illustrated further steps may also include depositing interlayer dielectrics, etching contact vias, filling the contact vias with conductive plugs, and the like as are conventional in the art of fabricating integrated circuits. Additional post-processing may include the formation of one or more metal layers (M1, M2, etc.) and interlayer dielectric layers therebetween to complete the various electrical connections in the integrated circuit. The present disclosure is not intended to exclude such further processing steps as are conventional to complete the fabrication of a functional integrated circuit.

ILLUSTRATIVE EXAMPLES

The present disclosure is now illustrated by the following non-limiting examples. It should be noted that various changes and modifications may be applied to the following examples and processes without departing from the scope of this disclosure, which is defined in the appended claims. Therefore, it should be noted that the following examples should be interpreted as illustrative only and not limiting in any sense.

Example 1

Four semiconductor substrates were prepared in accordance with FIG. 3, as described above. Each one of the substrates was subjected to a separate flowable CVD process. With regard to each flowable CVD process, the deposition materials and conditions remained the same, whereas the annealing processes differed. For the first substrate, no annealing was performed after FCVD. For the second substrate, standard, high-temperature annealing was performed at 600° C. For the third substrate, annealing in the presence of a process gas including $N_2$ and $H_2O_2$ was performed in accordance with the present disclosure, namely at 130° C. For the fourth substrate, annealing in the presence of the process gas was also performed, but at 400° C. Annealing time was about 6 hours for each of the four substrates. Each of the four substrates was then inspected to determine shrinkage using scanning electron microscopy (SEM), as well as subjected to a wet etching process to determine the etch rate of FCVD-formed oxide film. TABLE 1, set forth below, presents the results of the shrinkage and etch rate testing.

TABLE 1

| Anneal | Shrinkage | WER (A/min) |
|---|---|---|
| No Anneal | 0.0% | 256 |
| Anneal 600° C. | 10.4% | 204 |
| Anneal 130° C. | 2.5% | 200 |
| Anneal 400° C. | 6.2% | 171 |

As can be seen in TABLE 1, the non-annealed first substrate had no shrinkage because it was not annealed. However, the flowable film remaining is undesirable because of its high etch rate demonstrating little or no densification (which as noted above could lead to process variations in etching the film and in subsequently deposited layers). The high-temperature annealed second substrate demonstrates improved densification as shown by its relatively lower wet etch rate, but it has a shrinkage of over 10%, which could lead to stresses in the fins and undesirable fin bending. Substrate three, formed in accordance with the embodiments described herein, desirably exhibits both relatively lower shrinkage and relatively lower wet etch rates, meaning that the oxide films formed thereon have relatively less stress and are relatively greater densified. Substrate four exhibits a lower wet etch rate but still has shrinkage of over 6%.

Example 2

Figure 6A:
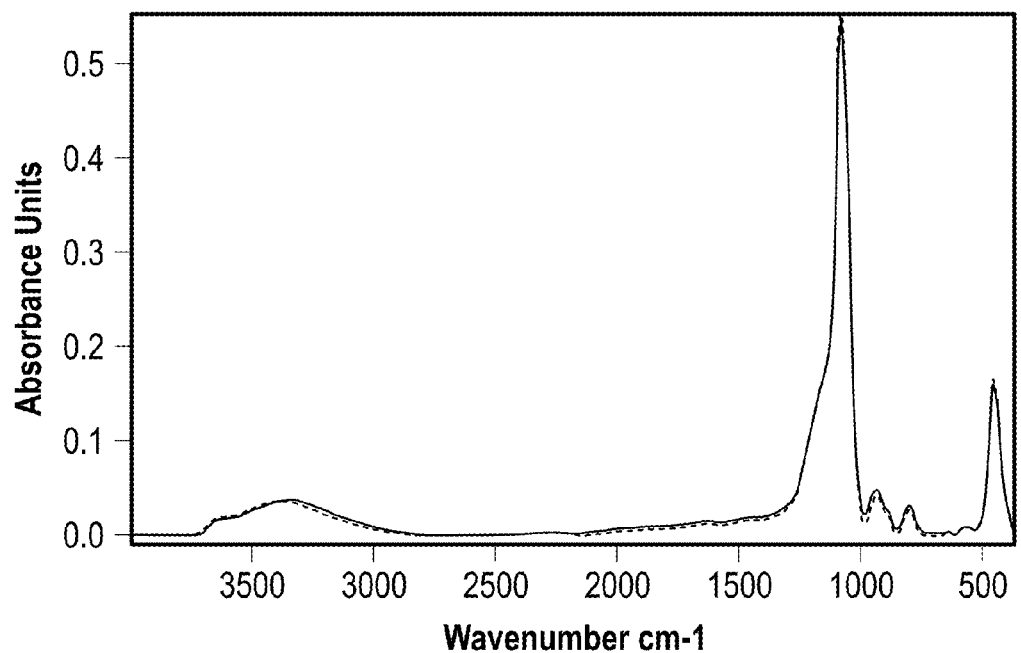
FIGS. 6A and 6B are Fourier transform infrared spectroscopy (FTIR) graphs showing silicon-oxygen bonding in an exemplary integrated circuit formed in accordance with certain embodiments of the present disclosure.
Figure 6B:
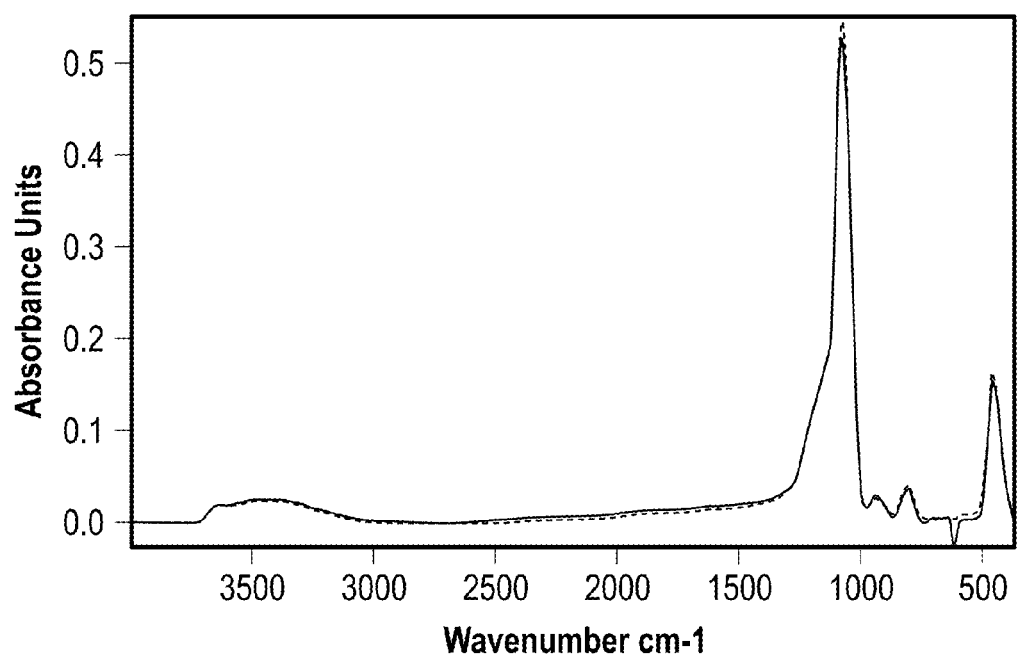

Two test substrates were prepared in accordance with FIG. 4 as described above using low-temperature anneal FCVD. Both substrates were then subjected to FTIR analysis to determine whether the flowable film was converted to the solid oxide film as desired. FIGS. 6A and 6B are the FTIR graphs for each for each of the two test substrates. As can be seen, strong Si—O bond peaks at 1080 $cm^{-1}$ demonstrate significant conversion to oxide. This is confirmed by the absence of strong peaks at 3550 $cm^{-1}$ (Si—OH bonding) and 2260 $cm^{-1}$ (Si—H bonding).

Example 3

Figure 7A:
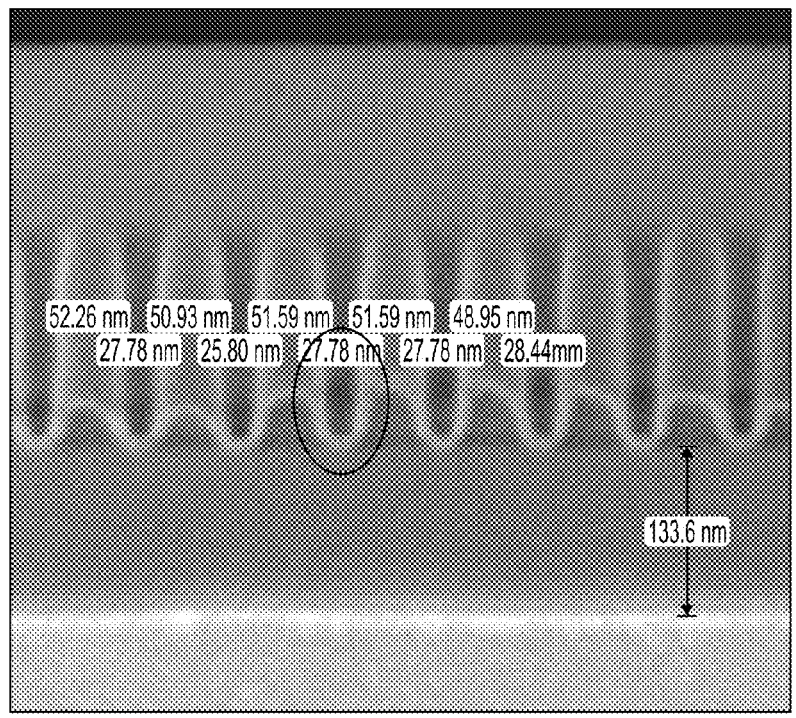
FIGS. 7A and 7B are scanning electron microscopy images showing STI structure densification in a prior art integrated circuit and an integrated circuit formed in accordance with an embodiment of the present disclosure, respectively.
Figure 7B:
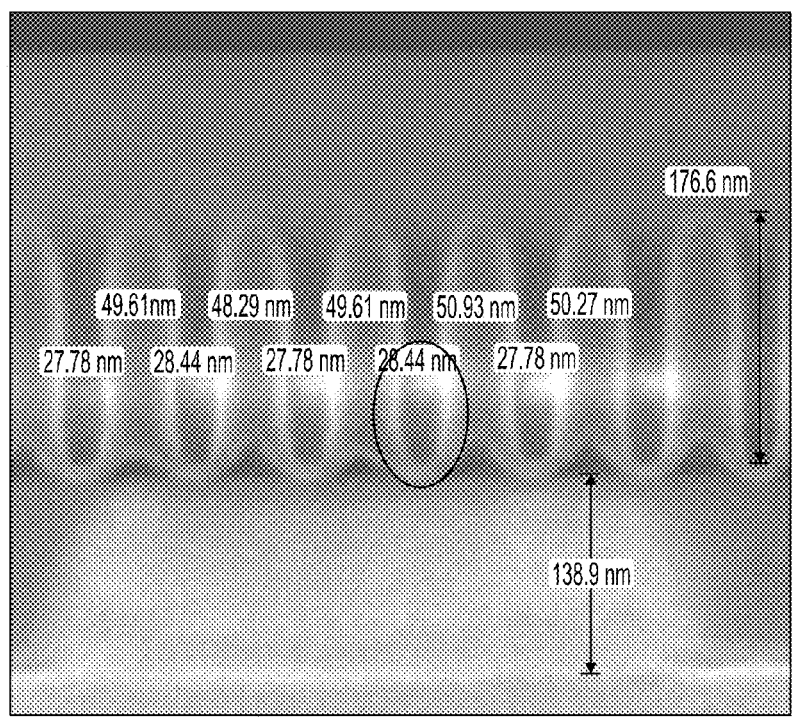

Two test substrates were prepared in accordance with FIG. 4, the first using conventional FCVD with high-temperature anneal and the second using low-temperature anneal in the presence of process gas in accordance with the present disclosure. Both substrates were then visually examined in cross-section using SEM. FIG. 7A shows the SEM image of the first substrate, and FIG. 7B shows the SEM image of the second substrate. As can be seen in the high-lighted oval areas of each image, the image in FIG. 7B demonstrates superior film quality at the bottom of the trench as compared to FIG. 7A, based on the color contrast. The superior film quality is as a result of increased densification of the silicon oxide layer, which is thus less damaged by subsequent etching processes.

Accordingly, the present disclosure has provided various embodiments of fabricating FinFET IC structures using FCVD with low-temperature anneal to form the STI structures providing electrical isolation to the fins. The described embodiments demonstrate less oxide shrinkage, which leads to less stress being placed on the fins, as well as improved densification, which leads to more uniform etching. Thus, the described embodiments will be appreciated to have less process variability than FCVD processes known in the prior art. Moreover, the described embodiments maintain a low "thermal budget" throughout the fabrication process to allow for the use of temperature sensitive structures in small-pitch devices, such as 14 nm and 10 nm regime devices.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
   forming an isolation trench between two fin structures on an integrated circuit substrate;
   forming a flowable film in the isolation trench using a flowable chemical vapor deposition process; and
   annealing the flowable film to form a silicon oxide dielectric layer in the isolation trench, wherein the annealing is performed at a temperature of less than about 200° C. with a process gas comprising $N_2$ and $H_2O_2$.

2. The method of claim 1, wherein annealing the flowable film is performed for a time period of about 4 hours to about 8 hours.

3. The method of claim 1, wherein annealing the flowable film is performed for a time period of about 5 hours to about 7 hours.

4. The method of claim 1, wherein forming the isolation trench between two fin structures comprises forming the isolation trench between two fin structures that are spaced apart for various devices at the 14 nm technology node.

5. The method of claim 1, wherein forming the isolation trench between two fin structures comprises forming the isolation trench between two fin structures that are spaced apart for various devices at the 10 nm technology node.

6. The method of claim 1, wherein annealing the flowable film is performed with a process gas comprising $N_2$ and $H_2O_2$ at a ratio of about 3:1 to about 1:3.

7. The method of claim 1, wherein annealing the flowable film is performed with a process gas comprising $N_2$ and $H_2O_2$ at a ratio of about 2:1 to about 1:2.

8. The method of claim 1, wherein annealing the flowable film is performed at a temperature of less than about 150° C.

9. The method of claim 1, wherein forming the isolation trench comprises forming the isolation trench on a bulk silicon integrated circuit substrate.

10. The method of claim 1, wherein forming the isolation trench comprises forming the isolation trench on a silicon-on-insulator (SOI) integrated circuit substrate.

11. The method of claim 1, wherein forming the flowable film in the isolation trench comprises forming a flowable film in the isolation trench comprising Si—O, Si—H, and Si—OH bonds.

12. The method of claim 11, wherein annealing the flowable film comprises converting the Si—O, Si—H, and Si—OH bonds into Si—O bonds.

13. The method of claim 1, further comprising planarizing the silicon oxide dielectric layer to form a planarized silicon oxide dielectric layer.

14. The method of claim 13, further comprising etching the planarized silicon oxide dielectric layer to form an etched silicon oxide shallow trench isolation structure.

15. The method of claim 14, further comprising forming a transistor gate over the two fin structures and over the etched silicon oxide shallow trench isolation structure.

16. A method for fabricating an integrated circuit comprising:
forming an isolation trench between two fin structures on an integrated circuit substrate at a pitch of 14 nm, 10 nm, or smaller;
depositing a flowable film comprising Si—O, Si—H, and Si—OH bonds in the isolation trench using a flowable chemical vapor deposition process that supplies a silicon-containing compound and an oxidant; and
annealing the flowable film to form a silicon oxide dielectric layer in the isolation trench, wherein the annealing is performed at a temperature of less than about 150° C. with a process gas comprising $N_2$ and $H_2O_2$ at a ratio of about 3:1 to about 1:3, and for a time period of about 4 hours to about 8 hours.

17. The method of claim 16, wherein annealing the flowable film is performed with the process gas comprising $N_2$ and $H_2O_2$ at a ratio of about 2:1 to about 1:2.

18. The method of claim 16, wherein annealing the flowable film is performed for a time period of from about 5 hours to about 7 hours.

19. The method of claim 16, wherein forming the isolation trench comprises forming the isolation trench on a bulk silicon integrated circuit substrate.

20. A method for fabricating an integrated circuit comprising:
forming an isolation trench between two fin structures on an integrated circuit substrate at a pitch of 14 nm, 10 nm, or smaller;
depositing a flowable film comprising Si—O, Si—H, and Si—OH bonds in the isolation trench using a flowable chemical vapor deposition process that supplies a silicon-containing compound and an oxidant;
annealing the flowable film to form a silicon oxide dielectric layer in the isolation trench, wherein the annealing is performed at a temperature of less than about 150° C. but greater than 50° C. with a process gas comprising $N_2$ and $H_2O_2$ at a ratio of about 3:1 to about 1:3, and for a time period of about 4 hours to about 8 hours;
planarizing the silicon oxide dielectric layer to form a planarized silicon oxide dielectric layer;
etching the planarized silicon oxide dielectric layer to form an etched silicon oxide shallow trench isolation structure; and
forming a transistor gate over the two fin structures and over the etched silicon oxide shallow trench isolation structure.

* * * * *